(12) United States Patent
Mori et al.

(10) Patent No.: US 7,486,544 B2
(45) Date of Patent: *Feb. 3, 2009

(54) SEMICONDUCTOR INTEGRATED CIRCUIT DEVICE

(75) Inventors: Ryo Mori, Higashiyamato (JP); Toshio Yamada, Kokubunji (JP); Tetsuya Muraya, Hamura (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/826,636

(22) Filed: Jul. 17, 2007

(65) Prior Publication Data

US 2008/0013368 A1    Jan. 17, 2008

Related U.S. Application Data

(63) Continuation of application No. 11/169,800, filed on Jun. 30, 2005, now Pat. No. 7,245,521.

(30) Foreign Application Priority Data

Jul. 30, 2004    (JP)    ............................. 2004-222823

(51) Int. Cl.
  *G11C 11/00*    (2006.01)
  *G11C 5/14*    (2006.01)

(52) U.S. Cl. .................. 365/156; 365/154; 365/189.09; 365/226

(58) Field of Classification Search .................. 365/156
  See application file for complete search history.

(56) References Cited

U.S. PATENT DOCUMENTS 5,706,226 A    1/1998    Chan et al.

5,726,562 A    3/1998    Mizuno (Continued)

FOREIGN PATENT DOCUMENTS

JP    06-216346    11/1993

(Continued)

*Primary Examiner*—Son L Mai
(74) *Attorney, Agent, or Firm*—Reed Smith LLP; Stanley P. Fisher, Esq.; Juan Carlos A. Marquez, Esq.

(57) ABSTRACT

The present invention provides a semiconductor integrated circuit device having an SRAM in which leak current is reduced. In an SRAM comprising a plurality of memory cells each constructed by a storage in which input and output terminals of two inverter circuits are cross-connected and a selection MOSFET provided between the storage and complementary bit lines and whose gate is connected to a word line, a substrate bias switching circuit is provided. In normal operation, the substrate bias switching circuit supplies a power source voltage to an N-type well in which a P-channel MOSFET of a memory cell is formed and supplies a ground potential of the circuit to a P-type well in which an N-channel MOSFET is formed. In the standby state, the substrate bias switching circuit supplies a predetermined voltage which is lower than the power source voltage and by which a PN junction between the N-type well and the source of the P-channel MOSFET is not forward biased to the N-type well, and supplies a predetermined voltage which is higher than the ground potential and by which a PN junction between the P-type well and the source of the N-channel MOSFET is not forward biased to the P-type well.

10 Claims, 8 Drawing Sheets

U.S. PATENT DOCUMENTS

| | | |
|---|---|---|
| 6,046,627 A | 4/2000 | Itoh et al. |
| 6,603,345 B2 | 8/2003 | Takahashi |
| 6,829,179 B2 | 12/2004 | Morikawa |
| 6,914,803 B2 | 7/2005 | Yamaoka et al. |
| 7,079,413 B2 | 7/2006 | Tsukamoto et al. |
| 7,245,521 B2 * | 7/2007 | Mori et al. .................. 365/156 |
| 2001/0038552 A1 | 11/2001 | Ishimaru |
| 2002/0034093 A1 | 3/2002 | Shioni |
| 2004/0252548 A1 | 12/2004 | Tsukamoto et al. |

FOREIGN PATENT DOCUMENTS

JP    2001-344979    3/2001

* cited by examiner

A: GATE LEAK Ig
B: CHANNEL LEAK Ioff

SEMICONDUCTOR INTEGRATED CIRCUIT DEVICE

CROSS-REFERENCE TO RELATED APPLICATION

This application is a Continuation Application of U.S. application Ser. No. 11/169,800 filed Jun. 30, 2005, now U.S. Pat. No. 7,245,521. Priority is claimed based on U.S. application Ser. No. 11/169,800 filed Jun. 30, 2005, which claims the priority of Japanese Patent Application No. 2004-222823 filed Jul. 30, 2004, all of which is incorporated by reference.

BACKGROUND OF THE INVENTION

The present invention relates to a semiconductor integrated circuit device and a technique effective when used for a semiconductor integrated circuit device having, for example, a static RAM.

Japanese Unexamined Patent Publication No. 2001-344979 (Patent Document 1) discloses an invention for solving a problem such that leak current in an off state increases due to decrease in threshold voltage of a transistor as a device becomes finer by supplying negative voltage to a word line to which the gate of an accessed (selected) transistor is connected at the time of standby. Japanese Unexamined Patent Publication No. Hei 6(1994)-216346 (Patent Document 2) discloses an invention in which threshold voltage is set to be high in advance, at the time of operation, small voltage is supplied in a forward bias direction to a substrate so that the threshold voltage decreases, and operation is performed while assuring desired operating speed. At the time of standby, power source voltage and ground potential are supplied to the substrate to perform operation with the high threshold voltage, thereby reducing leak current.

SUMMARY OF THE INVENTION

In a recent system LSI such as a 1-chip microcomputer, as a device becomes finer, the operation voltage and the threshold voltage of an MOSFET (insulated-gate field-effect transistor) are decreased. The decrease in the threshold voltage is achieved by reducing the thickness of a gate insulating film, and leak current in a gate insulating film which is not conventionally regarded as a problem becomes unignorable. The inventors herein have noticed the possibility of occurrence of a reverse phenomenon that leak current occurring in a gate insulating film is larger than the leak current between the source and drain is extremely high.

An object of the invention is to provide a semiconductor integrated circuit device having an SRAM in which leak current is reduced. The above and other objects and novel features of the invention will become apparent from the description of the specification and the appended drawings.

The outline of representative one of inventions disclosed in the application will be briefly described as follows. In an SRAM comprising a plurality of memory cells each constructed by a storage in which input and output terminals of two inverter circuits are cross-connected and a selection MOSFET provided between the storage and complementary bit lines and whose gate is connected to a word line, a substrate bias switching circuit is provided. In normal operation, the substrate bias switching circuit supplies a power source voltage to an N-type well in which a P-channel MOSFET of a memory cell is formed and supplies a ground potential of the circuit to a P-type well in which an N-channel MOSFET is formed. In the standby state, the substrate bias switching circuit supplies a predetermined voltage which is lower than the power source voltage and by which a PN junction between the N-type well and the source of the P-channel MOSFET is not forward biased to the N-type well, and supplies a predetermined voltage which is higher than the ground potential and by which a PN junction between the P-type well and the source of the N-channel MOSFET is not forward biased to the P-type well.

The gate leak current between the gates of the P-channel and N-channel MOSFETs as the components of the storage in the standby state can be reduced.

DETAILED DESCRIPTION OF THE PREFERRED EMBODIMENTS

Figure 1:
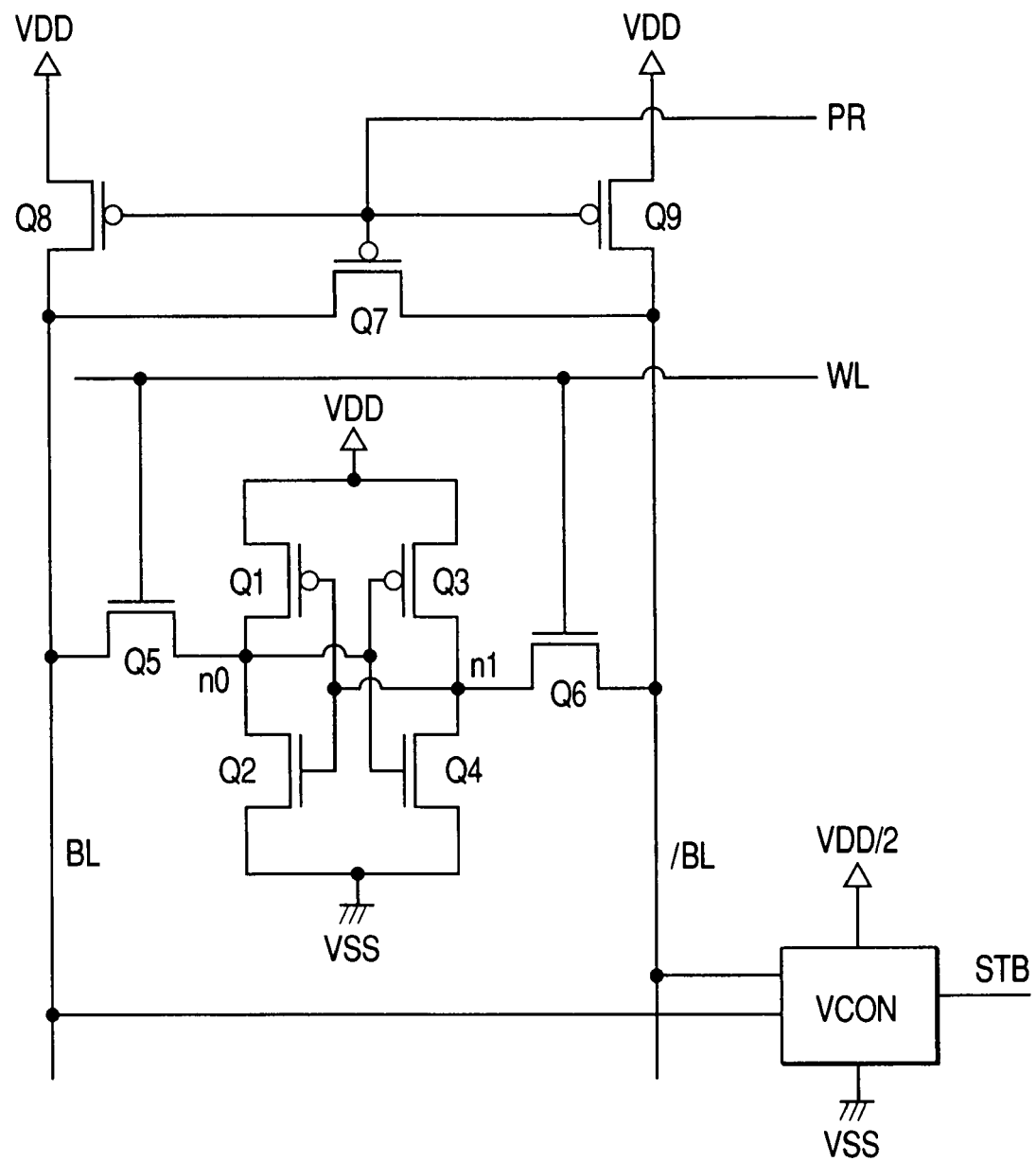
FIG. 1 is a circuit diagram showing an example of a static RAM according to the invention.

FIG. 1 is a circuit diagram showing an example of a static RAM according to the invention. In the diagram, one memory cell and a bit line potential control circuit are illustrated as representatives. In the memory cell, input and output terminals of a CMOS inverter circuit constructed by a P-channel MOSFET Q1 and an N-channel MOSFET Q2 and a CMOS inverter circuit constructed by a P-channel MOSFET Q3 and an N-channel MOSFET Q4 are cross-connected, thereby forming a latch (flip flop) circuit as a storage. A connection point between the output terminal of the CMOS inverter circuit (Q1, Q2) and the input terminal of the CMOS inverter circuit (Q3, Q4) serves as a storage node n0 as one of storage nodes, and a connection point between the input terminal of the CMOS inverter circuit (Q1, Q2) and the output terminal of the CMOS inverter circuit (Q3, Q4) serves as another storage node n1.

An N-channel MOSFET Q5 for address selection is provided between the storage node n0 and a bit line BL, and an N-channel MOSFET Q6 for address selection is provided between the other storage node n1 and a bit line /BL. The gate of each of the MOSFETs Q5 and Q6 is connected to a word line WL. P-channel MOSFETs Q8 and Q9 for precharge are provided between the bit lines BL and /BL and a power source voltage VDD, and a P-channel MOSFET Q7 for equalize is provided between the complementary bit lines BL and /BL. A precharge signal PR is supplied to the gates of the MOSFETs Q7 to Q9.

A bit line potential control circuit VCON is provided for the bit lines BL and /BL. When the bit line potential control circuit VCON receives a standby signal STB and enters a standby state where writing and reading operations are not performed on the memory cell for a predetermined period, an intermediate voltage such as VDD/2 or a low-level voltage such as a ground potential VSS of the circuit corresponding to a non-selection level of the word line WL, which is lower than the power source voltage VDD, is supplied to the bit lines BL and /BL. Although not shown, an address selection circuit for selecting/non-selecting the word line WL sets, in the standby state, all of word lines to the low level such as the ground potential VSS.

As described above, by setting all of the word lines WL to a non-selection level (=ground potential VSS) in the standby state and setting the bit lines (BL, /BL) to the level (VDD/2 or VSS) lower than the precharge potential (=VDD), the potential between the gates in the MOSFETs Q5 and Q6 and the substrate (well) becomes the same as the substrate potential (=ground potential VSS) by the non-selection level of the word lines WL. Consequently, no leak current flowing between the gate and the substrate via a gate insulating film occurs. When the bit line potential is set to VDD/2 by the bit line potential control circuit VCON as described above, only VDD/2 is applied among the gate, source and drain, so that the leak current can be reduced to the half. When the bit line potential is set to VSS as described above, occurrence of the leak current among the gate, source, and drain can be prevented.

It is also possible to omit the bit line potential control circuit VCON, set the precharge signal PR to the high level in the standby state, and turn off the precharge MOSFETs Q8, Q9, and Q7. At this time, the bit lines BL and /BL are set to a high impedance state. Therefore, even if a leak current occurs among the gate, source and drain, it just discharges the parasitic capacitance in the bit lines BL and /BL. The level finally reaches the VSS level and no leak current flows.

Figure 2:
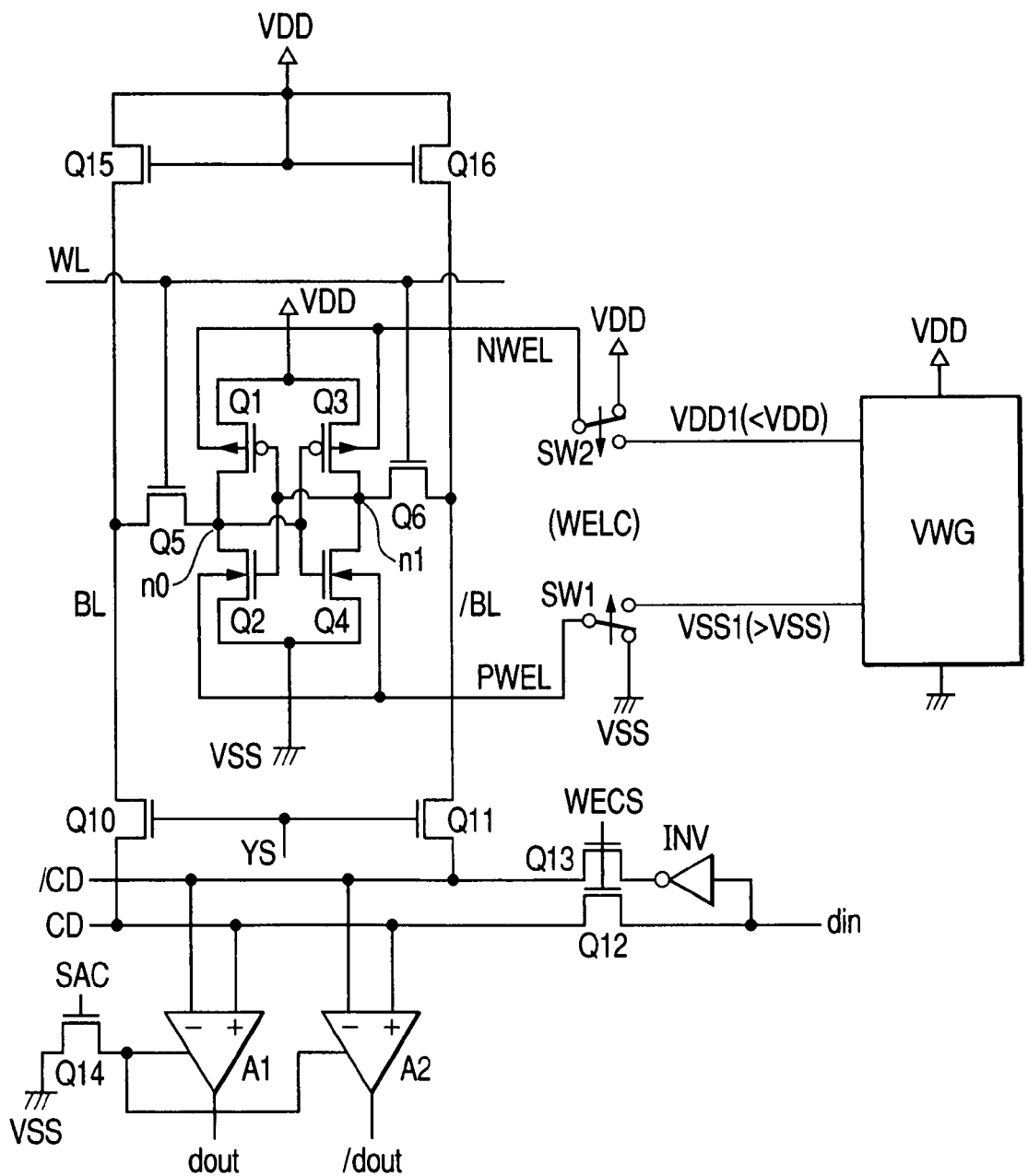
FIG. 2 is a circuit diagram showing another example of the static RAM according to the invention.

FIG. 2 is a circuit diagram showing another example of the static RAM according to the invention. FIG. 2 illustrates a memory cell similar to the above-described memory cell, a pair of complementary bit lines BL and /BL, a word line WL, a substrate control voltage generating circuit VWG, a change-over switch and a column switch for the circuit VWG, common data lines CD and /CD, and a write circuit and a read sense amplifier corresponding to the common data lines CD and /CD.

The memory cell illustrated as a representative is constructed by MOSFETs Q1 to Q6 similar to the above. In the embodiment, load MOSFETs Q15 and Q16 of the N-channel type are provided between the bit lines BL and /BL and the power source voltage VDD. The bit lines BL and /BL are connected to the common data lines CD and /CD via column switches constructed by N-channel MOSFETs Q10 and Q11. To the common data lines CD and /CD, input terminals of sense amplifiers taking the form of single-end-type differential amplifying circuits A1 and A2 are connected. From the output terminals of the two amplifying circuits A1 and A2, complementary output signals dout and /dout are generated. A bias current is passed from an N-channel MOSFET Q14 which is turned on by a sense amplifier activate signal SAC to the amplifying circuits A1 and A2 so as to be activated.

To the common data line CD, a write signal din generated by a not-shown write amplifier is supplied via an N-channel MOSFET Q12 which is switched by a write signal WECS is supplied. To the common data line /CD, a signal obtained by inverting the write signal din by an inverter circuit INV is supplied via an N-channel MOSFET Q13 switched by the write signal WECS is supplied.

In the memory cell of the embodiment, the leak current includes channel leak current and gate leak current. In the case where the storage node n0 is at the high level and the storage node n1 is at the low level in the memory cell, the channel leak current is generated between the drain and source of the P-channel MOSFET Q1 and the N-channel MOSFET Q4. The gate leak current is generated between the gates of the N-channel MOSFET Q2 and the P-channel MOSFET Q3 and the substrate (well).

To reduce the gate leak current in the storage part of the memory cell in the standby state, the switches SW1 and SW2 are switched by the control signal WELC, voltage VDD1 smaller than the power source voltage VDD is applied to an N-type well (NWEL) in which the P-channel MOSFETs Q1 and Q3 are formed, and voltage VSS1 larger than the ground potential VSS is supplied to a P-type well (PWEL) in which the N-channel MOSFETs Q2 and Q4 are formed. The voltages VDD1 and VSS1 are generated by the substrate control voltage generating circuit VWG. In the case of returning to the normal operation, the power source voltage VDD is supplied to the N-type well (NWEL) and the ground potential VSS is supplied to the P-type well by the switches SW1 and SW2.

Since the power source voltage VDD is applied to the sources of the P-channel MOSFETs Q1 and Q3, the voltage VDD1 is set to predetermined voltage at which the PN junction between the substrate and the source of each of the MOSFETs Q1 and Q3 is not biased forward. That is, the VDD1 is set so as to satisfy the relation of VDD-VDD1< about 0.7V. Similarly, the ground potential VSS is applied to the sources of the N-channel MOSFETs Q2 and Q4, so that the voltage VSS1 is set to predetermined voltage by which the PN junction between the substrate and the sources of the MOSFETs Q2 and Q4 is not forward-biased. That is, VSS1 is set so as to satisfy the relation of VSS1-VSS< about 0.7V. By switching between the substrate voltages VDD1 and VSS1, also in the storage of the memory cell in the standby state, the potential difference between the gate and the substrate decreases and, accordingly, the gate leak current can be reduced.

Figure 3:
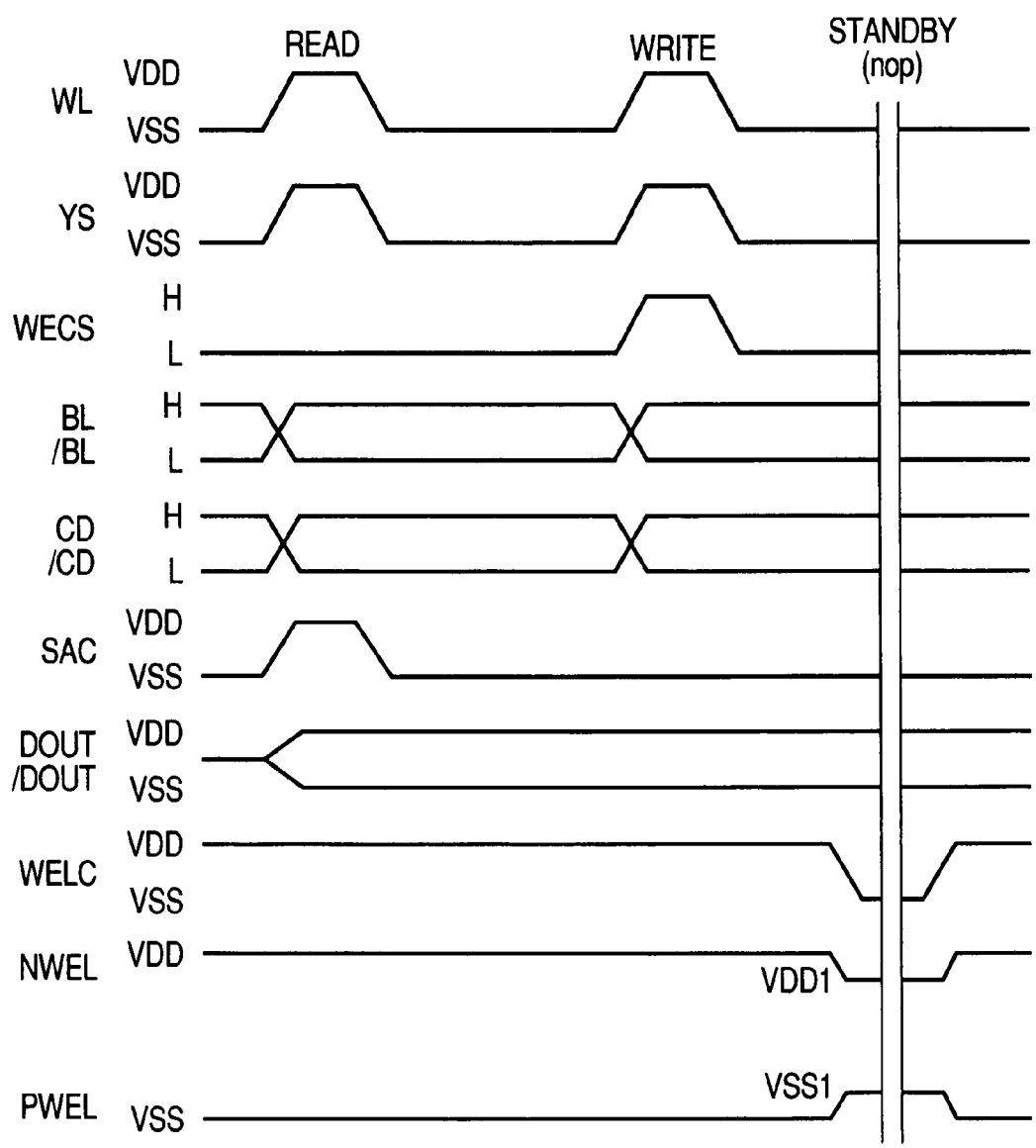
FIG. 3 is a timing chart for explaining an example of the operation of the static RAM of FIG. 2.

FIG. 3 is a timing chart illustrating an example of the operations of the static RAM of FIG. 2. At the time of reading, the word line WL is set to the selection level such as the power source voltage VDD. A column selection signal YS is also set to the high level such as the power source voltage VDD. By the selection of the word line WL, a high level and a low level are output to the bit lines BL and /BL in accordance with the storage state, and read signals of the bit lines BL and /BL selected by the column selection signal YS are transmitted to the common data lines CD and /CD.

By the high level (VDD) of the sense amplifier activate signal SAC, the MOSFET Q14 is turned on, the differential amplifying circuits A1 and A2 become operating, the read signal of the memory cell transmitted to the common data lines CD and /CD is amplified, and the output signals DOUT and /DOUT are output via a not-shown output circuit. Although not limited, a latch circuit is provided for the output circuit and, even when the sense amplifier is set in a non-operative state, the amplification signal is maintained. On completion of the reading operation, the sense amplifier activate signal SAC is set to the low level (VSS) and the differential amplifying circuits A1 and A2 are set to the non-operative state, that is, the bias current is interrupted.

Also at the time of writing, the word line WL is set to the selection level like the power source voltage VDD. The column selection signal YS is also set to the high level like the power source voltage VDD. The write control signal WECS is set to the high level (H), the MOSFETs Q12 and Q13 are turned on, and the write signal din is transmitted to the memory cell via the common data lines CD and /CD, MOSFETs Q10 and Q11, and bit lines BL and /BL to rewrite the storage state of the memory cell.

In the standby or no-operation (NOP) state, the control signal WELC is set to the low level. Accordingly, the switch SW1 switches VSS to VSS1 and supplies VSS1 to the substrate PWEL of the N-channel MOSFETs Q2 and Q4. The switch SW2 switches VDD to VDD1 and supplies VDD1 to the substrate NWEL of the P-channel MOSFETs Q1 and Q3. When the standby state is reset to the normal state, the control signal WELC is set to the high level. Consequently, by the switches SW1 and SW2, VSS is supplied to the substrate PWEL of the N-channel MOSFETs Q2 and Q4 and VDD is supplied to the substrate NWEL of the P-channel MOSFETs Q1 and Q3. After that, the reading operation or writing operation is executed.

Figure 4:
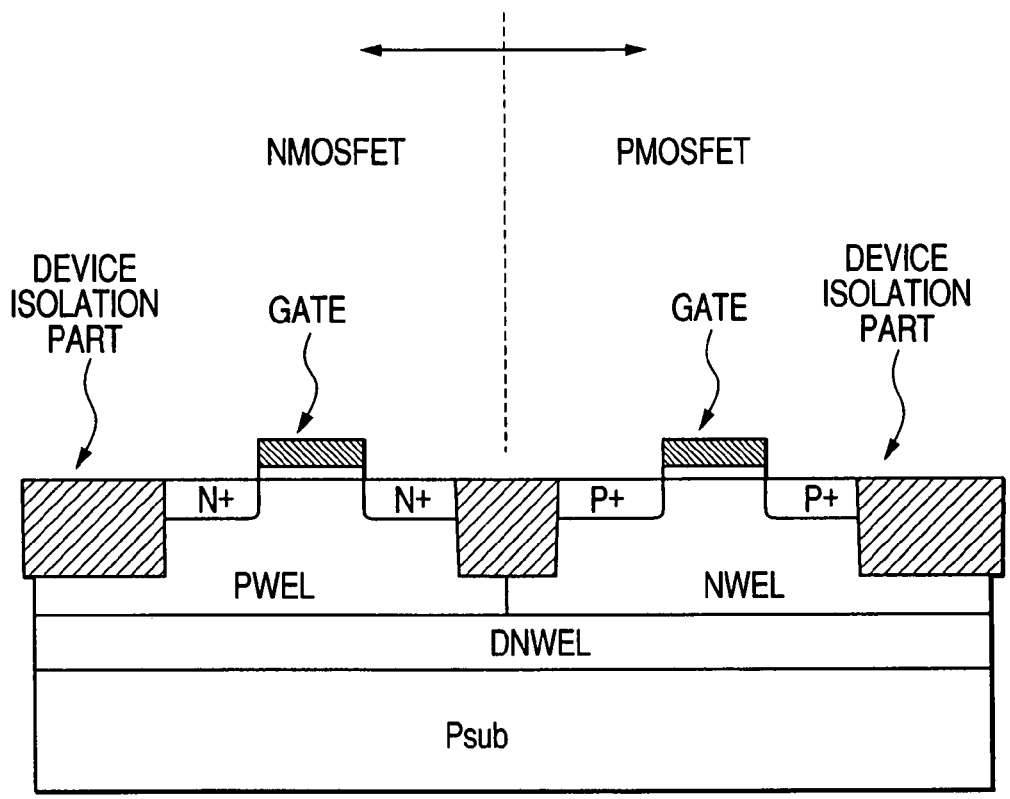
FIG. 4 is a device cross section showing an example of a MOSFET used for the invention.

Leak current in the size-reduced MOSFET will be described hereinbelow with reference to FIGS. 4 to 9. FIG. 4 is a device section of the MOSFET used for the invention. A deep N-type well region DNWEL is formed above a P-type semiconductor substrate Psub. In a region in which an N-channel MOSFET (NMOSFET) is formed, the P-type well region PWEL is formed. In a region in which a P-channel MOSFET (PMOSFET) is formed, the N-type well region NWEL is formed. A device isolation part is formed around the MOSFET (NMOSFET and PMOSFET). The device isolation part is constructed by, for example, a silicon oxide layer. The N-channel MOSFET (NMOSFET) is constructed by forming a gate insulating film and a source and a drain made by an N+ layer while sandwiching a gate electrode formed on the gate insulating film. The P-channel MOSFET (PMOSFET) is constructed by a gate insulating film and the source and the drain made by a P+ layer while sandwiching a gate electrode formed on the gate insulating film.

Figure 5:
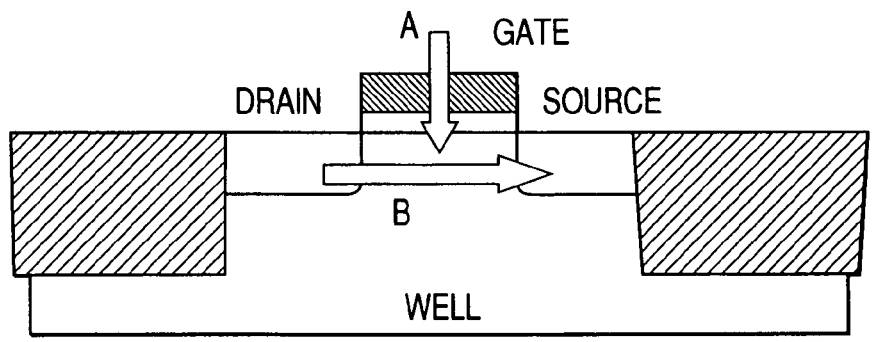
FIG. 5 is a diagram illustrating leak current in the MOSFET used for the invention.

FIG. 5 is a diagram illustrating leak currents in the MOSFET. In the diagram, a well, a drain, a source, a gate, and a device isolation part of a generalized N-channel or P-channel MOSFET are shown, and current paths of leak currents A and B are indicated by arrows. The leak current A is current flowing through the gate insulating film and includes current flowing between the gate and the substrate (well), the gate and the drain, and the gate and the source. The leak current B is current flowing between the drain and the source when the MOSFET is in an off state. Hereinbelow, the current A is expressed as gate leak current Ig and the current B is expressed as channel leak current Ioff.

Figure 6:
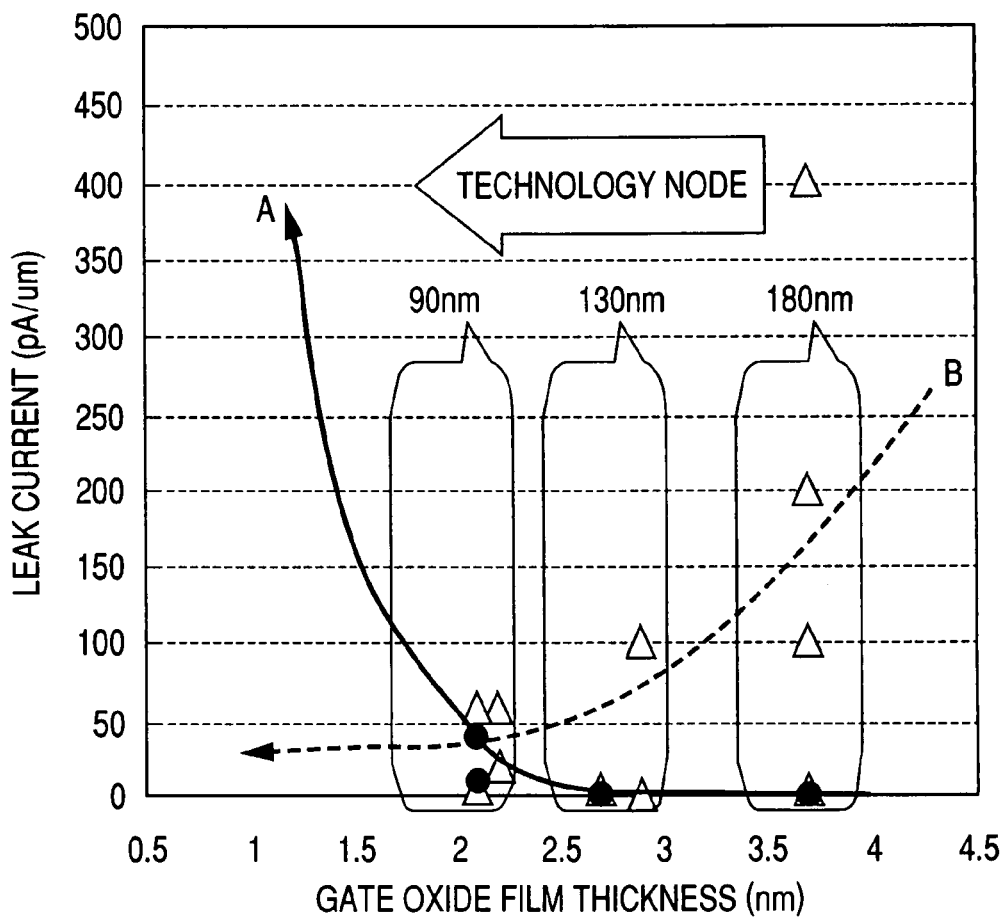
FIG. 6 is a characteristic diagram showing the relation between the thickness of a gate oxide film and the leak current examined by the inventors of the present invention.

FIG. 6 is a characteristic diagram showing the relation between the gate oxide film thickness and the leak current examined by the inventors of the present invention. In the technology node of 90 nm or larger, that is, in a 90-nm process, a 130-nm process, and a 180-nm process (the gate length is 90 nm, 130 nm, and 180 nm, respectively), the thickness of the gate oxide film is set to about 2 nm, about 2.5 to 3 nm, and about 3.5 to 4 nm, respectively. In the diagram, the channel leak (Ioff) occupies most of the standby (leak) current as shown in the characteristic B indicated by the broken line. In the technology node of the next generation of 90 nm or finer, the gate leak Ig increases dramatically like the characteristic A expressed by the solid line, and it is expected that Ig becomes larger than Ioff (Ig>Ioff). It suggests that the problem cannot be solved by the methods disclosed in the patent documents 1 and 2 paying attention only to the channel leak current Ioff.

Figure 7:
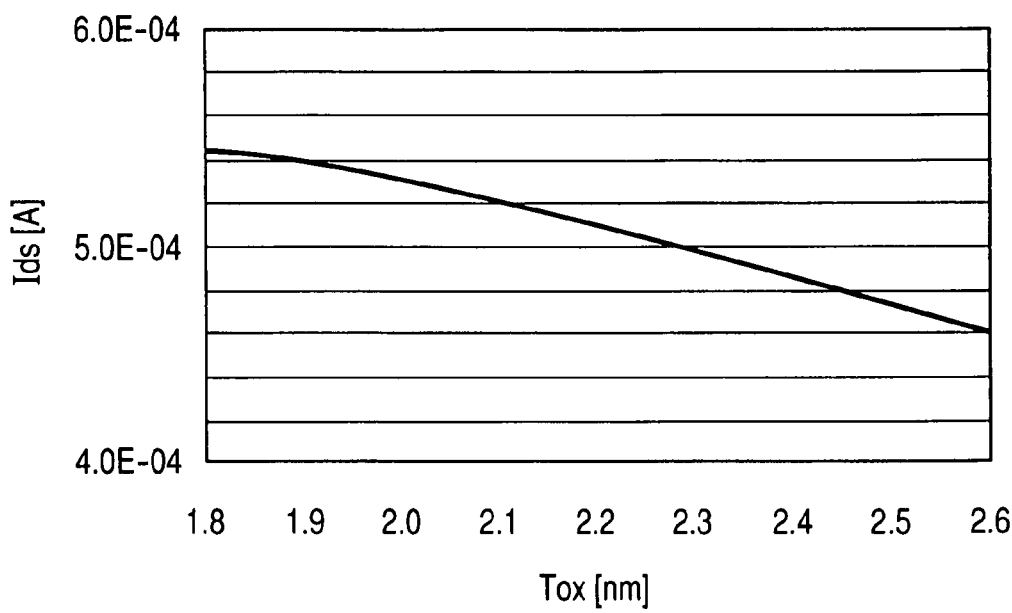
FIG. 7 is a characteristic diagram showing the relation between drain current Ids and the thickness Tox of a gate oxide film in an N-channel MOSFET as an example.
Figure 8:
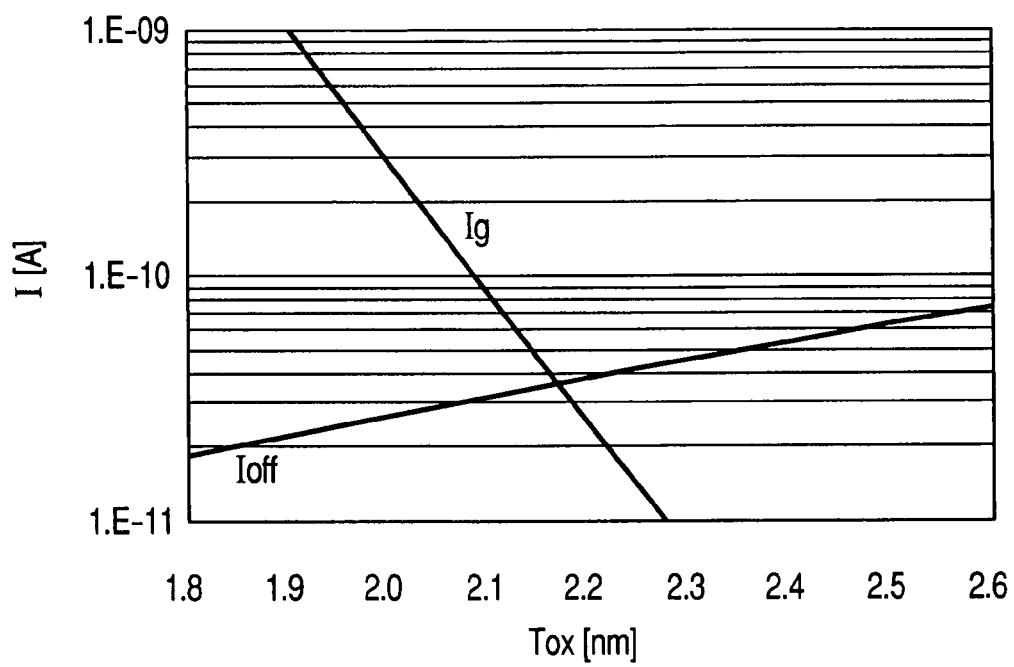
FIG. 8 is a characteristic diagram showing the relation between the leak current and the thickness of the gate oxide film.
Figure 9:
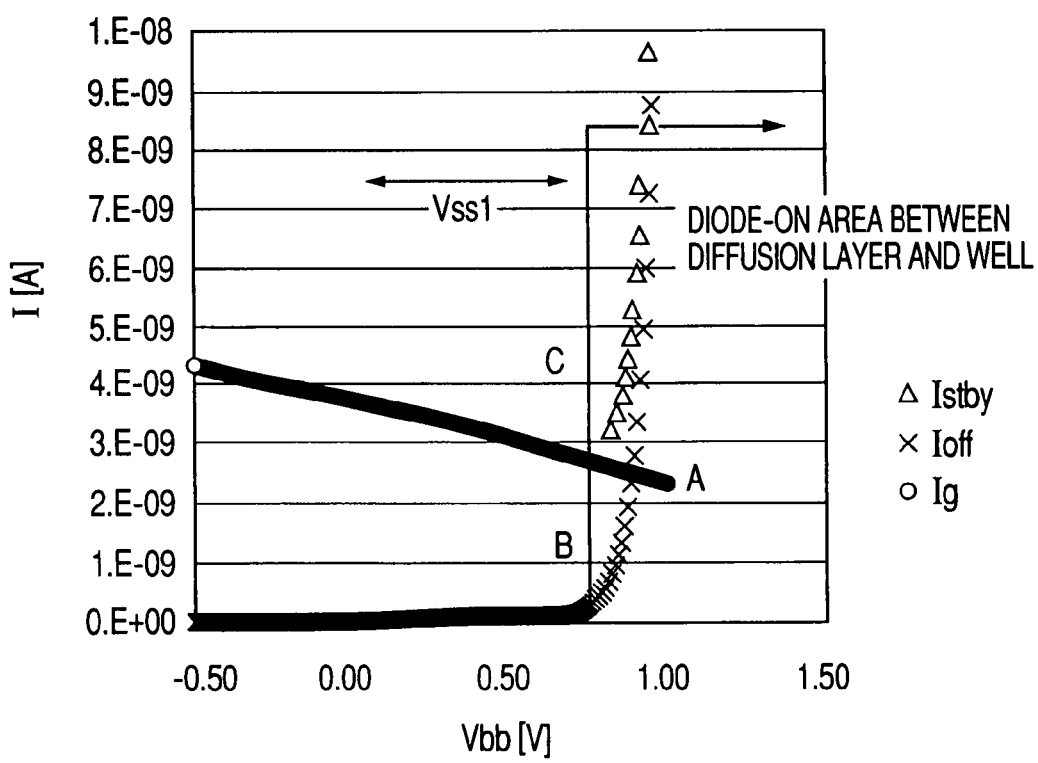
FIG. 9 is a characteristic diagram showing the relation between the leak current and well potential.

FIG. 7 is a characteristic diagram showing the drain current Ids and the thickness Tox of the gate oxide film in the case of an N-channel MOSFET as an example. FIG. 8 is a characteristic diagram showing the leak current I and the thickness Tox of the gate oxide film. FIG. 9 is a characteristic diagram showing the leak current I and the substrate bias voltage Vbb. FIGS. 7 to 9 are obtained by computer simulation by the inventors herein. It is understood that when the thickness Tox is reduced as shown in FIG. 7, the drain current Ids increases. It is, however, expected that, as shown in FIG. 8, in the latest node having a gate length of 90 nm or less, that is, in the finer semiconductor technology of the next generation, the thickness Tox reaches 2 nm, the gate leak current Ig exponentially increases, and the relation between the gate leak current Ig and the channel leak current Ioff becomes inverted.

FIG. 8 is a characteristic diagram showing dependency of the gate leak current Ig and the channel leak Ioff of the N-channel MOSFET having Lg=0.1 um and Wg=1 um in the storage of the memory cell on the film thickness Tox. In the evaluation, the film thickness Tox is about 2.1 nm and Ig>Ioff. It is understood that as the gate film becomes thinner, the gate leak current Ig becomes dominant over the channel leak Ioff which has been regarded as a main cause of the leak current.

FIG. 9 shows dependency of the gate leak current Ig in a state where the gate of the N-channel MOSFET having Tox=2.1 nm under the configuration of Ig>Ioff is on, the channel leak Ioff in a state where the gate is off, and Istby (=Ig+Ioff) on the well potential Vbb. The characteristic A in the diagram shows the gate leak current Ig, the characteristic B shows the channel leak current Ioff, and the characteristic C indicates the standby leak current Istby=Ig+Ioff. By setting the well potential so that the potential difference becomes smaller as compared with the gate potential (VSS→VSS1), a potential at which leak current sum Istby is smaller than that in the time the well potential is 0V exists. It is understood from the diagram that Istby=3.8 nA when the substrate=0V (VSS), Istby=3.2 nA when the substrate=0.5V (VSS1), and the leak current can be reduced by 15% on condition that the PN junction between a diffusion layer and a well is not forward biased.

The embodiment of FIG. 2 uses a circuit aiming at reducing leak current under the condition of Ig>Ioff by increasing the potential of the P-well PWEL of the N-channel MOSFET to a potential (VSS1) at which the diode between the source diffusion layer and the well is not turned on and by decreasing the potential of the N well NWEL of the P-channel MOSFET to a potential (VDD1) at which the diode between the source diffusion layer and the well is not turned on.

Figure 10:
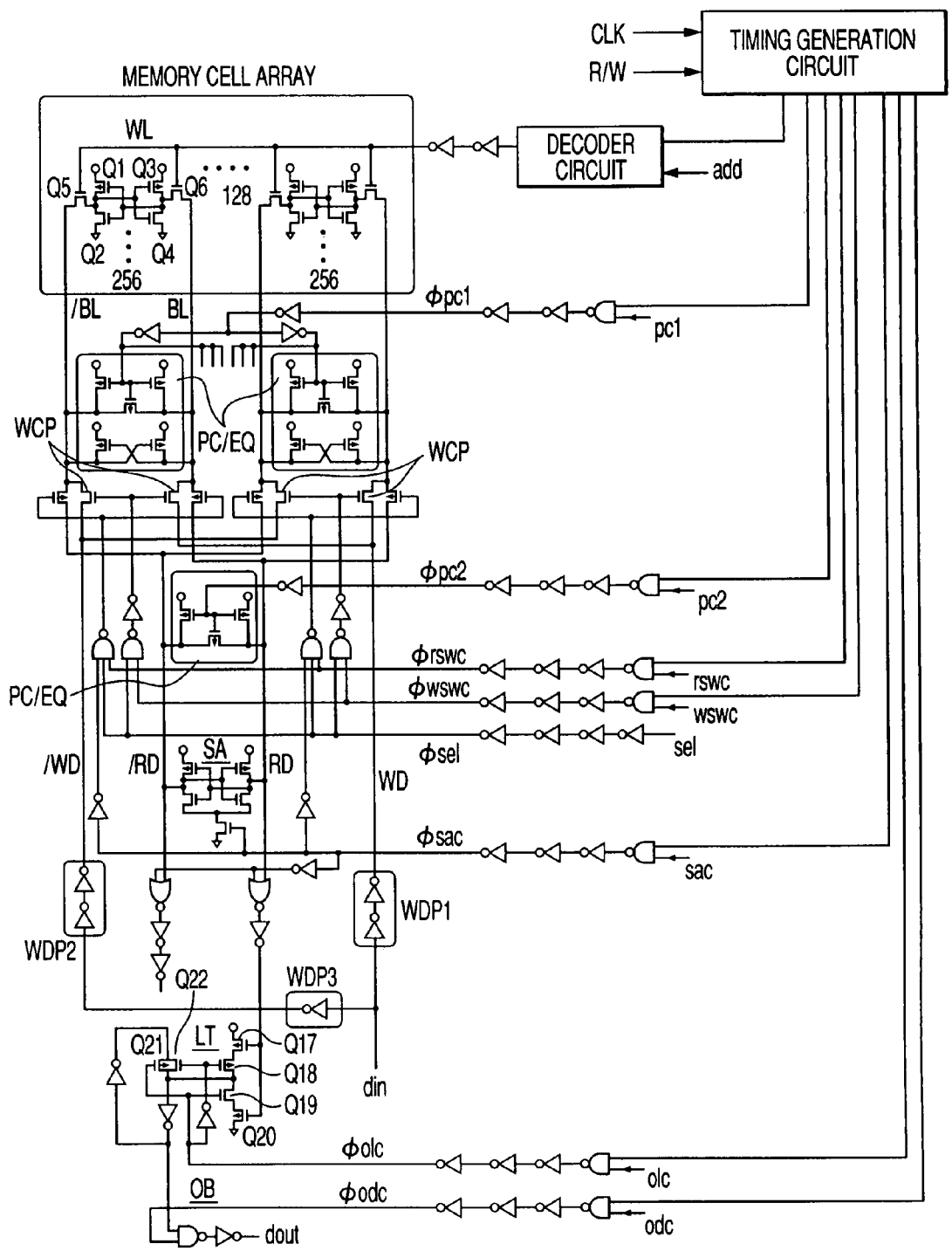
FIG. 10 is a general circuit diagram showing an example of a static RAM of the invention.

FIG. 10 is a general circuit diagram of an example of a static RAM according to the invention. The static RAM is constructed by a memory cell array, an address selection circuit, a read circuit, and a write circuit provided in the peripheral circuit of the memory cell array, and a timing generating circuit for controlling the operation.

As a memory cell array, one word line WL, two pairs of complementary bit lines BL and /BL, and two memory cells provided at the intersecting points are illustrated as representatives. The memory cell is constructed by: a latch circuit in which input and output terminals of two CMOS inverter circuits constructed by the P-channel MOSFETs Q1 and Q3 and the N-channel MOSFETs Q2 and Q4 are cross-connected; and a selection switch constructed by the N-channel MOSFETs Q5 and Q6 between the pair of input and output nodes of the latch circuit and the bit lines BL and /BL. The gates of the MOSFETs Q5 and Q6 are connected to the word line WL.

Although not limited, in the memory cell array, 128 memory cells are disposed for one word line WL. Therefore, 128 pairs of complementary bit lines BL and /BL are provided. For a pair of bit lines BL and /BL, 256 memory cells are disposed. Therefore, 256 word lines WL 0 to 255 are provided. For each of the bit lines BL and /BL, a precharge & equalize circuit PC/EQ is provided. The precharge & equalize circuit PC/EQ is constructed by a P-channel MOSFET for applying precharge voltage such as the power source voltage to the complementary bit lines BL and /BL in a manner similar to FIG. 1 and a P-channel MOSFET for short-circuiting the complementary bit lines BL and /BL. In the example, a P-channel MOSFET in which the gate and the drain are cross-connected is provided as a pull-up MOSFET between the complementary bit lines BL and /BL and the power source terminal. With the configuration, a voltage drop in the bit line on the high level side at the time of reading can be prevented.

Although not limited, the 128 pairs of bit lines are connected to 32 pairs of complementary read data lines RD and /RD by column switches for reading constructed by P-channel MOSFETs. To one read data line RD or /RD, one of four pairs of bit lines BL and /BL is connected. A sense amplifier SA is provided for the read data lines RD and /RD. The sense amplifier SA is constructed by a CMOS latch circuit in which input and output terminals of two CMOS inverter circuits constructed by P-channel MOSFETs and N-channel MOSFETs are cross-connected, and an N-channel MOSFET provided between the source of the N-channel MOSFET of the CMOS latch circuit and the ground potential of the circuit. In correspondence with the 32 pairs of the read data lines RD and /RD, total 32 sense amplifiers SA are provided.

A timing signal generated by a timing generating circuit and a timing control signal ϕsac generated by a gate circuit which receives a sense amplifier selection signal sac are transmitted via an inverter circuit train to the gate of the N-channel MOSFET which activates the sense amplifier SA and the gate circuit for transmitting an amplification signal of the sense amplifier SA. The timing control signal ϕsac is also used as a selection signal of the column switch for reading. The sense amplifier SA is made activate by the selection signal and amplifies signals of the read data lines RD and /RD.

The amplification signal of the sense amplifier SA is transmitted to a latch circuit LT constructed by MOSFETs Q17 to Q22, and an output signal dout is generated by an output circuit OB. The latch circuit LT is constructed by a through latch circuit controlled by a signal ϕolc generated on the basis of an output latch control signal olc. The output circuit OB is constructed by a gate circuit controlled by a signal ϕodc generated on the basis of an output driver control signal odc and an output inverter circuit.

In the embodiment, although not limited, reading operation of activating all of the 32 sense amplifiers SA and outputting a read signal of 32 bits, reading operation of activating 16 sense amplifiers SA out of the 32 sense amplifiers and outputting a read signal of 16 bits, or reading operation of activating eight sense amplifiers SA out of the 32 sense amplifiers SA and outputting a read signal of 8 bits can be selectively performed. The sense amplifier selection signal sac controls the sense amplifiers SA or the like in accordance with the three kinds of reading operations and is used as a non-selection signal of the column switch for reading constructed by a P-channel MOSFET by a read switch control signal rswc and a column selection signal sel.

The 128 pairs of bit lines are connected to the 32 pairs of complementary write data lines WD and /WD by the column switches (WCP) for writing constructed by N-channel MOSFETs. One write data line WD or /WD is connected to any one of four pairs of bit lines BL and /BL by the column switch. For the write data lines WD and /WD, a write circuit (write amplifier) constructed by an inverter circuit train (WDP1) for transmitting the write signal din to the write data line WD, an inverter circuit (WDP3) for generating an inverted write signal, and an inverter circuit line (WDP2) for transmitting an inverted write signal to the write data line /WD is provided. 32 pieces of the write circuits are provided in correspondence with the 32 pairs of complementary write data lines WD and /WD.

The SRAM of the embodiment can selectively perform, although not limited, writing operation of making a write signal of 32 bits generated by the 32 write amplifiers valid, writing operation of making a read signal of 16 bits generated by 16 write amplifiers out of the 32 write amplifiers valid, or writing operation of making a write signal of 8 bits generated by eight write amplifiers out of the 32 write amplifiers valid. For this purpose, a write switch control signal wswc is used. In the embodiment, the column selection signal is combined with the write switch control signal wswc and transmitted to a column switch for writing constructed by an N-channel MOSFET.

An amplification signal of the sense amplifier SA is transmitted to the MOSFETs Q17 to Q22 via a gate circuit and a latch circuit constructed by an inverter circuit, and an output signal dout is generated by the gate circuit and an output inverter circuit. To the gate of the N-channel MOSFET which activates the sense amplifier SA and the gate circuit for transmitting the amplification signal of the sense amplifier SA, a timing signal generated by a timing generating circuit and the timing control signal ϕsac generated by the gate circuit receiving the sense amplifier selection signal sac are transmitted via an inverter circuit train as a part of a control path. The timing control signal ϕsac is also used as a non-selection signal of the column switch for reading.

The timing generating circuit receives a clock CLK and a plurality of control signals typified by a read/write control signal R/W and generates various timing signals necessary for the operation of the SRAM in correspondence with an operation mode such as reading operation, writing operation, or standby operation of the SRAM. Although not shown, a control signal STB in FIG. 1, the control signal WELC of FIG. 2, and the like are generated.

One of 256 word lines WL is selected by a word driver receiving a selection signal generated by a decoder circuit. The decoder circuit receives the timing signal generated by the timing generating circuit and an address signal add and generates a selection signal of the word line and a selection signal of a column. In the operation mode of the standby operation or the like, all of the word lines are set to the non-selection level irrespective of the address signal add. The column selection signal generated by the decoder circuit is used to generate the control signals sac, rswc, wswc, and the like in correspondence with the 32-bit operation, 16-bit operation, or 8-bit operation by a not-shown logic circuit.

Figure 11:
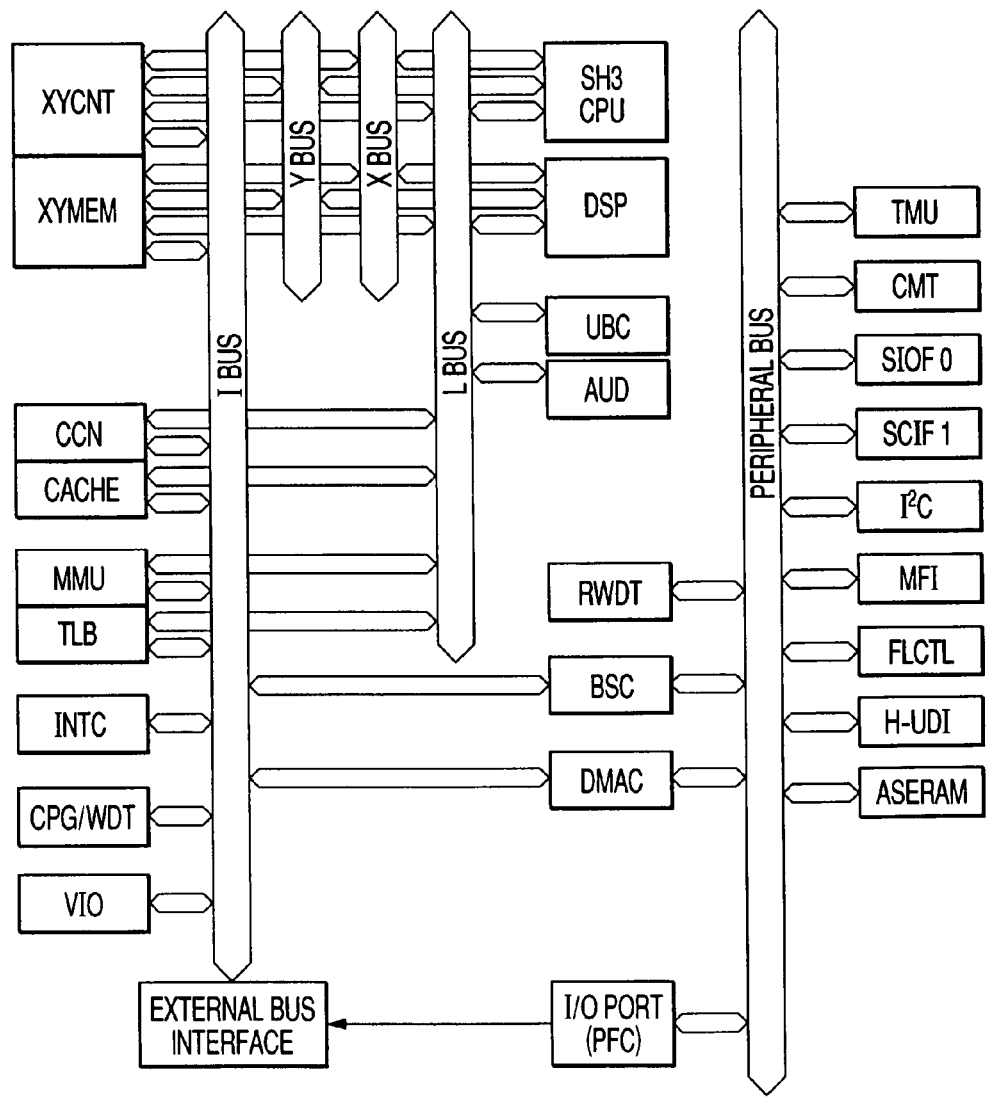
FIG. 11 is a block diagram showing an example of a semiconductor integrated circuit device to which the invention is applied.

FIG. 11 is a block diagram showing an embodiment of a semiconductor integrated circuit device such as a microprocessor (hereinbelow, called microcomputer LSI) to which the invention is applied. Circuit blocks of the diagram are formed on a single substrate of single crystal silicon or the like by a known CMOS (complementary MOS) semiconductor integrated circuit manufacturing technique.

Although not limited, the microcomputer LSI realizes high-performance arithmetic process by a centralized processing unit CPU of an RISC (Reduced Instruction Set Computer) type. The microcomputer LSI on which peripheral devices necessary for system configuration are integrated is applied to portable devices. The central processing unit CPU has an instruction set of the RISC type and a basic instruction operates by 1-instruction 1-state (1 system clock cycle) by pipeline process. The centralized processing unit CPU and the data signal processor DSP as main components and the following peripheral circuits are mounted for, for example, a cellular phone.

Internal buses include an I bus, a Y bus, an X bus, an L bus, and a peripheral bus. As built-in peripheral modules, a memory XYMEM for image processing and a memory controller XYCNT are provided so that a user system can be constructed by the minimum number of parts. The memory XYMEM and the controller XYCNT are connected to the I bus, X bus, Y bus, and L bus, and data input/output operation for image processing and data output operation for display operation are performed. As built-in memories such as the memory XYMEM and a cache memory CACHE, an SRAM as shown in FIGS. 1, 2 or 10 is used.

For the I bus, the cache memory CACHE, a cache memory controller CCN, a memory management controller MMU, a translation look-aside buffer TLB, an interrupt controller INTC, a clock oscillator/watch dog timer CPG/WDT, a video I/O module VIO, and an external bus interface are provided. Via the external bus interface, the I bus is connected to a not-shown external memory LSI or the like.

To the L bus, the cache memory CACHE, cache memory controller CCN, memory management controller MMU, translation look-side buffer TLB, centralized processing unit CPU, data signal processor DSP, a user break controller UBC, and an advanced user debugger AUD are connected.

To the peripheral bus, a 16-bit timer unit TMU, a compare match timer CMT, a serial I/O (with FIFO) SIOF0, an FIFO-built-in serial communication interface SCIF1, an I²C controller I²C, a multifunctional interface MFI, an NAND/AND flash interface FLCTL, a user debug interface H-UDI, an ASE memory ASERAM, a pin function controller PFC, and an RCLK operation watch dog timer RWDT are connected. To the peripheral bus and the I bus, a bus state controller BSC and a direct memory access controller DMAC are connected.

By reducing the gate leak current Ig as in the embodiment, the standby current at the time of standby can be reduced in the SRAM according to the invention. By applying the invention to an SRAM module to be mounted on a system LSI, the standby current can be reduced, so that there is an effect of reducing the standby current of the whole system LSI. Therefore, higher processing speed and lower power consumption of the memory XYMEM for image processing and the cache memory CACHE are realized as in the embodiment, and an LSI satisfying high-speed operation specifications and low power consumption can be realized. By applying the invention to an on-chip memory of the system LSI, a high-performance LSI can be realized.

Although the invention achieved by the inventors herein has been concretely described on the basis of the embodiments, obviously, the invention is not limited to the foregoing embodiments but can be variously modified without departing from the gist of the invention. For example, the SRAM of FIG. 2 may have a configuration that the precharge MOSFETs Q8 and Q9 and equalize MOSFET Q7 are provided for the bit lines BL and /BL as in the SRAM of FIG. 1. The number of word lines and the number of bit lines constructing the memory cell array of the SRAM mounted on a semiconductor integrated circuit device may be arbitrary numbers. The invention can be applied not only to the SRAM mounted on a system LSI but also to a DRAM as a general memory. The invention can be widely used for semiconductor integrated circuit devices each including an SRAM.

What is claimed is:

1. A semiconductor integrated circuit device comprising:
   a plurality of memory cells each comprised of a storage in which input and output terminals of two inverter circuits are cross-connected and a selection MOSFET provided between said storage and complementary bit lines and whose gate is connected to a word line;
   an address selection circuit for setting all of word lines to a non-selection level in a standby state where any of writing and reading operations is not performed on said memory cell; and
   a substrate bias switching circuit,
   wherein in normal operation, said substrate bias switching circuit supplies a power source voltage to an N-type well in which a P-channel MOSFET of a memory cell is formed, and
   wherein in said standby state, said substrate bias switching circuit supplies to said N-type well a predetermined voltage which is lower than said power source voltage and by which a PN junction between the N-type well and the source of the P-channel MOSFET is not forward biased.

2. The semiconductor integrated circuit device according to claim 1,
   wherein a load MOSFET is provided between said complementary bit lines and the power source voltage, and
   wherein in said standby state, said load MOSFET is turned off.

3. The semiconductor integrated circuit device according to claim 2,
   wherein said two inverter circuits as components of said memory cell are CMOS inverter circuits, and
   wherein said selection MOSFET is an N-channel MOSFET.

4. The semiconductor integrated circuit device according to claim 3, further comprising a bit line potential control circuit for setting the potential of the complementary bit lines to a voltage lower than the power source voltage in said standby state.

5. The semiconductor integrated circuit device according to claim 1, wherein the MOSFET as a component of the memory cell has a gate insulating film which thickness is less or below 2.1 nm.

6. A semiconductor integrated circuit device comprising:
   a plurality of memory cells each comprised of a storage in which input and output terminals of two inverter circuits are cross-connected and a selection MOSFET provided between said storage and complementary bit lines and whose gate is connected to a word line;
   an address selection circuit for setting all of word lines to a non-selection level in a standby state where any of writing and reading operations is not performed on said memory cell; and
   a substrate bias switching circuit,
   wherein in normal operation, said substrate bias switching circuit supplies a ground potential to a P-type well in which an N-channel MOSFET is formed, and
   wherein in said standby state, said substrate bias switching circuit supplies to said P-type well a predetermined voltage which is higher than said ground potential and by which a PN junction between the P-type well and the source of the N-channel MOSFET is not forward biased.

7. The semiconductor integrated circuit device according to claim 6,
wherein a load MOSFET is provided between said complementary bit lines and the power source voltage, and
wherein in said standby state, said load MOSFET is turned off 8. The semiconductor integrated circuit device according to claim 7,
wherein said two inverter circuits as components of said memory cell are CMOS inverter circuits, and
wherein said selection MOSFET is an N-channel MOSFET.

9. The semiconductor integrated circuit device according to claim 8, further comprising a bit line potential control circuit for setting the potential of the complementary bit lines to a voltage lower than the power source voltage in said standby state.

10. The semiconductor integrated circuit device according to claim 6, wherein the MOSFET as a component of the memory cell has a gate insulating film which thickness is less or below 2.1 nm.

* * * * *